United States Patent [19]
Duvvury

[11] Patent Number: 5,714,783
[45] Date of Patent: Feb. 3, 1998

[54] FIELD-EFFECT TRANSISTOR

[75] Inventor: Charvaka Duvvury, Plano, Tex.

[73] Assignee: Texas Instruments Incorporated, Dallas, Tex.

[21] Appl. No.: 226,238

[22] Filed: Apr. 11, 1994

Related U.S. Application Data

[60] Continuation of Ser. No. 25,542, Mar. 3, 1993, abandoned, which is a division of Ser. No. 808,826, Dec. 17, 1991, Pat. No. 5,221,635.

[51] Int. Cl.$^6$ .............. H01L 23/62; H01L 29/76; H01L 29/94
[52] U.S. Cl. .............. 257/355; 257/336; 257/344
[58] Field of Search .............. 257/355, 408, 257/344, 336, 335, 337, 356, 357, 358, 360

[56] References Cited

U.S. PATENT DOCUMENTS

| | | | |
|---|---|---|---|
| 4,005,450 | 1/1977 | Yoshida et al. | 257/408 |
| 4,052,229 | 10/1977 | Pashley | 257/355 |
| 4,382,826 | 5/1983 | Pfleiderer et al. | 257/355 |
| 4,808,544 | 2/1989 | Matsui | 257/408 |
| 4,868,138 | 9/1989 | Chan et al. | 437/44 |
| 4,878,100 | 10/1989 | McDavid | 257/408 |
| 4,920,445 | 4/1990 | Jun | 361/91 |
| 4,956,311 | 9/1990 | Liou et al. | 437/57 |
| 4,968,644 | 11/1990 | Gallagher et al. | 437/192 |
| 4,981,810 | 1/1991 | Fazan et al. | 437/44 |
| 5,019,888 | 5/1991 | Scott et al. | 257/355 |
| 5,162,888 | 11/1992 | Co et al. | 257/355 |
| 5,281,841 | 1/1994 | Van Roozendaal et al. | 257/360 |

FOREIGN PATENT DOCUMENTS

| | | | |
|---|---|---|---|
| 60-150388 | 7/1985 | Japan . | |
| 61-214576 | 9/1986 | Japan | 257/360 |
| 0011273 | 1/1987 | Japan . | |
| 62-11273 | 1/1987 | Japan . | |
| 1-37852 | 8/1987 | Japan . | |

OTHER PUBLICATIONS

*Electrical Overstress/Electrostatic Discharge Symposium Proceedings*, EOS/ESD Assoc. and IIT IIT Research Institute, Lin et al., Oct. 1994, "A CMOS VLSI ESD Input Protection Device, DIFIDW", pp. 202–209.

*Primary Examiner*—Wael Fahmy
*Attorney, Agent, or Firm*—Ira S. Matsil; James C. Kesterson; Richard L. Donaldson

[57] ABSTRACT

A field-effect transistor possesses improved electrostatic discharge characteristics. The transistor (10), formed in a p-type semiconductor substrate, comprises a gate (16) that forms a channel between two adjacent n-regions (12 and 14). At least one of the n-regions (12) has an n-well (22) below and centered about a contact pad (18). The n-well (22) has a second lower concentration of n-type impurities than either of the n-regions.

18 Claims, 1 Drawing Sheet

FIELD-EFFECT TRANSISTOR

This application is a Continuation of application Ser. No. 08/025,542, filed Mar. 3, 1993 now abandoned which is a division of application Ser. No. 07/808,826, filed Dec. 17, 1991 (issued Jun. 22, 1993 as U.S. Pat. No. 5,221,635).

TECHNICAL FIELD OF THE INVENTION

This invention relates to integrated circuits, and more particularly to a field-effect transistor.

BACKGROUND OF THE INVENTION

Integrated circuits are vulnerable to a phenomenon generically referred to as electrostatic discharge ("ESD"). During handling, integrated circuits can build up relatively large static charges on their inputs. These charges, if not properly compensated for, may flow or "discharge"to a lower potential region. Discharging in this way produces large electric fields within the transistors that are immediately connected to the various inputs and outputs of a particular circuit. High electric fields in turn, produce high temperature gradients and ultimately yield thermal electrode migration ("TEM") within the transistor. TEM describes how a transistor fails when the contact to a doped source/drain region separates from the region. TEM causes irreversible circuit failures. ESD and TEM become more severe as circuits dimensions decrease. The smaller the dimension of, for instance, a doped drain region, the higher the electric field will be per charge. As a result, new semiconductor technologies require more effective designs to overcome these problems.

Heretofore, electronics designers have relied on the inherent diode existing between the source/drain region and the grounded substrate of a NMOS FET or of a n-channel FET in a CMOS transistor pair. The p-n junction in such a transistor protects the contact from up to 18 volts of charge buildup. After approximately that amount of buildup, however, ESD occurs from the drain to the ground plane through the substrate. Some designs modify certain characteristics of the drain to improve ESD performance. In particular, in some transistors may increase the distance between the affected contact and the gate. This modification increases the ESD protection up to a distance of approximately 6 μm. Beyond 6 μm, however, the ESD performance flattens and ultimately decreases as electrostatic charge shorts to the p substrate material at a different point. Such a transistor also suffers from lower gain as the larger source-drain region increases resistivity. Other designers simply increase the volume of the n drain to increase the area of the drain-substrate interface. Unfortunately, this also increases the resistance and capacitance of the transistor. The transistor, therefore, suffers from a lower gain and a lower maximum switching speed.

Therefore, a need exists for a transistor having a greater breakdown voltage between the source-drain regions and the corresponding p substrate with no loss of switch performance.

SUMMARY OF THE INVENTION

In accordance with the present invention, a field-effect transistor is provided which substantially eliminates and prevents the above disadvantages and problems associated with prior transistors.

The transistor of the present invention is formed in a p-type semiconductor substrate and comprises a gate that forms a channel between two adjacent n-regions. At least one of the n-regions has an n-well below and centered about a contact pad. The n-well has a second lower concentration of n-type impurities than either of the n-regions.

The present invention provides numerous technical advantages over prior transistors. A transistor constructed according to the present invention exhibits a greater breakdown voltage between n-doped regions and the related p substrate. This substantially improves the device's electrostatic discharge or ESD performance.

Additionally, the disclosed transistor minimizes system resistance and capacitance to permit faster transistor switching speeds.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

The preferred embodiment of the present invention and its advantages are best understood by referring to FIGS. 1 through 4 of the drawings, like numerals being used for like and corresponding parts of the various drawings.

Figure 1:
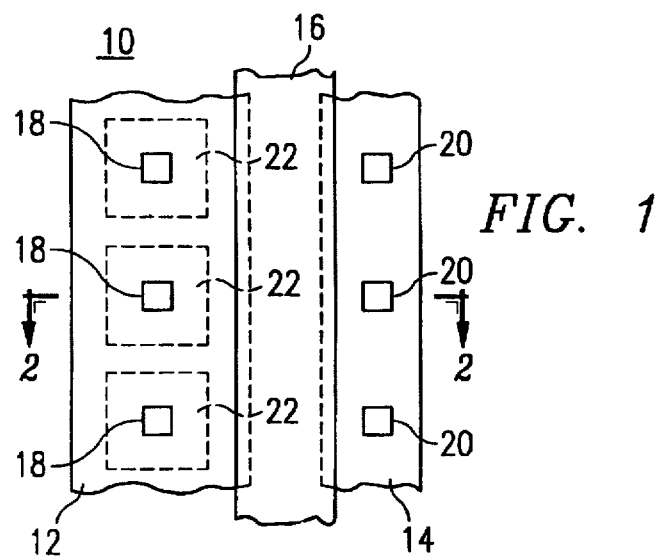
FIG. 1 depicts in planar view a transistor made according to the preferred embodiment of the present invention.

FIG. 1 depicts generally a planar view of a metal oxide semiconductor field-effect transistor 10 ("MOSFET") wherein a second n region provides improved ESD performance. MOSFET 10 is an NMOS transistor or a n-channel transistor of a CMOS transistor pair. MOSFET 10 has a first n-type source-drain region 12 and a second n-type source-drain region 14. Each region is either doped or implanted into a p-type substrate. An insulator (depicted in FIG. 2) separates metal gate 16 from the underlying p-substrate. Contact pads 18 and 20 supply or remove electric current from doped regions 12 and 14 respectively. Pads 18 and 20 are typically exposed subregions of regions 12 and 14 and permit an ohmic contact to other components (not depicted). First source-drain region 12 also contains an n-well 22 below each of the contact pads 18. As will be described below, each n-well 22 increases the ESD performance of MOSFET 10.

Metal gate 16 controls the flow of current between regions 12 and 14 by creating an electric field between the two regions. An electric field causes a channel to form in the substrate between regions 12 and 14 and below the gate insulating layer.

Figure 2:
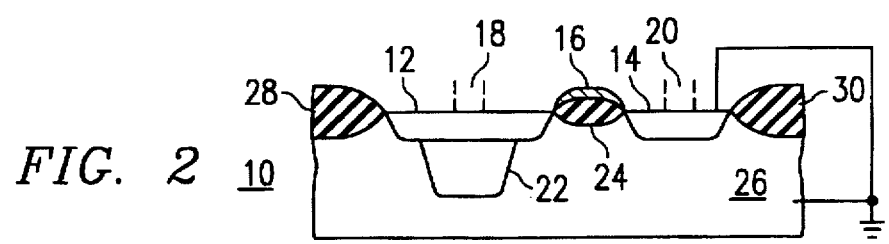
FIG. 2 depicts a cross sectional view taken along line 2—2 of FIG. 1.

FIG. 2 depicts a cross-sectional view of MOSFET 10 along line 2—2 of FIG. 1 that shows the vertical integration of n-well 22 and first source-drain region 12. In addition, insulating layer 24 separates gate 16 from substrate 26. Substrate 26 includes a p-type semiconductor material, while regions 12 and 14 are heavily doped ("n+") with n-type impurities. A lower concentration of n-type impurities than either region 12 or 14 dopes n-well 22.

Transistor 10 naturally forms two p-n junctions that act as diodes. One of these, the junction between region 12 and substrate 26, may act as a barrier to the discharge of positive electrostatic charge from contact 18 to the ground plane through substrate 26. ESD from contact 20 is not a concern for positive polarity stress since, region 14 electrically connects to substrate 26 through the ground plane. Also, it is not a concern for negative polarity stress for grounded substrate technologies. However, the barrier between region 12 and substrate 26 limits the ESD characteristics of region 12 in previous transistors. In particular, source-drain region 12 must have a low resistance and low capacitance in these transistors. These requirements lead to the constraints of small size and high concentrations of n-type carriers. Small size, however, causes large temperature gradients across the region and makes the transistor more susceptible to thermal electrode migration or TEM. A high dopant concentration in region 12 causes a relatively low breakdown voltage between region 12 and substrate 26. For example, charge flows between region 12 and substrate 26 when a voltage difference of 18 volts develops between the two regions. Typically, the concentration of n carriers is $10^{19}$ atoms/cm$^3$ in regions 12 and 14.

According to the preferred embodiment, a well of lightly doped n-type carriers below contact 18 in region 12 improves ESD performance without substantially increasing system resistance or capacitance. Lightly doping a region below contact 18, increases the breakdown voltage between region 12 and substrate 26 to between 40 and 50 volts. This breakdown voltage increase gives the transistor the breakdown voltage of a lightly doped p-n junction and does not depend on the size of n-well 22. The size of the contact pad 18 limits the size of n-well 22. The footprint of the n-well should be generally the same size or larger than the footprint of the contact pad 18. Present semiconductor processes, however, may fabricate contact pads 18 substantially smaller than n-well 22. In particular, present technology limits the size of n-well 22 to approximately 6×6µm², while contact pad 18 may be approximately 1.5×1.5µm². N-well 22 must extend below the bottom of the overlying source-drain region 12. N-well 22 preferably extends to a total depth of five to seven times the depth of region 12. N-well 22 within region 18 has little or no effect on the performance of MOSFET 10. The depth of n-well 22 therefore ranges from 1 to 2 µm for typical 0.5 µm processes.

Transistor 10 may be fabricated from a combination of photolithographic processes according to known methods.

EXAMPLE

Transistor 10 begins with a p-type semiconductor substrate, preferably a p-type silicon substrate 26. Substrate 26 is then masked such that only the surface of substrate 26 below regions 28 and 30 is exposed. Field oxide regions 28 and 30 are formed in accordance with well-known processes utilized to prove device-to-device isolation. In particular, regions 28 and 30 may be formed by the local-oxidation-of-silicon ("LOCOS") or the poly-buffered LOCOS process ("PBL"). The remaining photoresist mask is then removed.

Insulating layer 24 is formed using the same techniques as regions 28 and 30. The resulting component is first masked with photoresist to expose only the surface of substrate 26 where layer 24 is to be grown. The entire workpiece is covered with 5,000 to 10,000 Angstroms of aluminum to form gate 16. The unwanted aluminum will be removed with the underlying photoresist layer when the resist layer is removed.

The substrate at this point then acts as a self-aligned implant mask for regions 12 and 14. The heavily doped source-drain regions 12 and 14 are implanted with an n-type species such as arsenic, phosphorus, or antimony. Here the implantation is performed at 100 keV at a dose of 1E15 atoms/cm². Following the implantation, a rapid thermal anneal ("RTA") or furnace anneal process is performed. The RTA process is preferably performed at 1,000° C. for 30 seconds. Furnace annealing may be instead used at, for instance, 900° C. for one hour. The resulting n+ regions are approximately 0.5 µm deep and have a resistivity of approximately 25 to 30 ohms/sq.

A third mask is then applied to obscure all of region 12 except the central area around the future site of each contact pad. A lighter dose of the same species is then implanted to form n-well 22 to a depth of approximately 1 micron. The second implantation step may be accomplished with an implant energy of 150 keV and a dose of 1E13 atoms/cm². This results in an n-type region having a resistivity of approximately 1500 Ohms/sq. The third photoresist layer may then be removed.

FET 10 is completed by applying another mask, exposing contact pads 18 on regions 12 and 14, depositing an interconnect layer, and patterning the layer to connect FET 10 to other elements on substrate 26.

Figure 3:
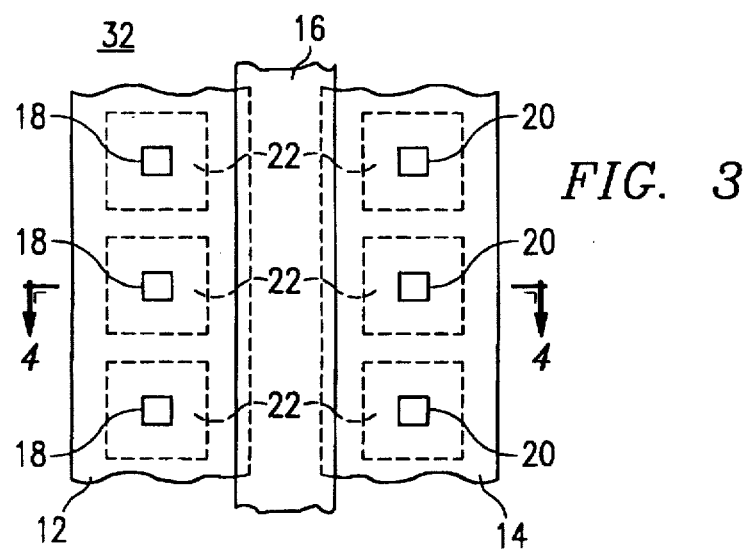
FIG. 3 depicts in planar view a transistor according to an alternative embodiment of the present invention.
Figure 4:
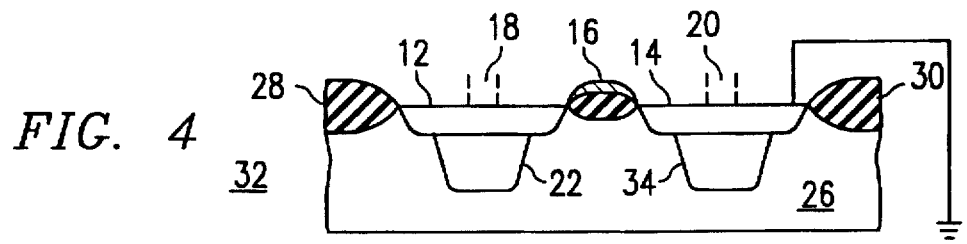
FIG. 4 depicts a cross sectional view taken along line 4—4 of FIG. 3.

FIGS. 3 and 4 depict a second embodiment of the disclosed invention for use with floating substrate technology MOSFETs. NMOS FET 32 differs from the transistor depicted in FIGS. 1 and 2 in that source drain region 14 is not connected to substrate 26. Electrostatic discharge may therefore occur under certain circumstances between second region 14 and substrate 26 for negative polarity stress. In such a case, it is advantageous to place a second n-well 34 to protect transistor 32 more completely. N-well 34 is constructed using the same techniques as described above.

Although the disclosed invention is described in connection with an abrupt junction thick-field NMOS FET, its scope should not be limited to such devices. The disclosed invention is applicable to other technologies including those transistors fabricated with lightly doped drains, double diffused drains and with thin oxide or polysilicon gate transistors.

Moreover, although the present invention and its advantages have been described in detail, it should be understood that various changes, substitutions and alterations can be made herein without departing from the spirit and scope of the invention as defined by the appended claims.

What is claimed is:

1. A transistor having a cross-section comprising:

a p-type substrate having a first surface;

a gate disposed adjacent the first surface of the substrate;

first and second n-doped source-drain regions formed within the substrate adjacent the gate, each source-drain region having a first doping concentration and extending into said substrate at a selected depth;

a channel region within said substrate and abutting both said first and second source-drain regions;

a first contact pad formed over a portion of said first source-drain region; and a first lightly doped n-region formed within the substrate, said lightly doped n-region spaced from said first surface by said first source-drain region, said lightly doped n-region having a doping concentration less than said first doping concentration, said lightly doped n-region disposed entirely below a continuous portion of said first source-drain region.

2. The transistor of claim 1 further comprising:

a second contact pad formed over a portion of the second source-drain region: and a lightly doped n-region below the second contact pad.

3. The transistor of claim 1 wherein said first source-drain region extends a first selected depth from the surface of said substrate and said lightly doped n-region extends a second selected depth from the first surface of said substrate, wherein said second selected is depth five to seven times deeper than the depth of said first selected depth.

4. The transistor of claim 1 wherein said substrate comprises silicon.

5. The transistor of claim 1 wherein said n-doped source drain regions are doped with arsenic dopants.

6. The transistor of claim 1 and further comprising field insulation regions adjacent said source-drain regions.

7. The transistor of claim 1 wherein said gate comprises aluminum.

8. The transistor of claim 4 and further comprising a lightly doped drain region formed adjacent said channel.

9. The transistor of claim 1 and further comprising a double diffused drain region formed in said substrate.

10. A semiconductor device, comprising of:

a conductive region disposed at an upper surface of a semiconductor region of a first conductivity type;

first and second doped regions formed within said semiconductor region adjacent said conductive region and separated by an underlying region, said underlying region disposed beneath said conductive region, wherein each of said first and second doped regions abuts said underlying region, said doped regions having a selected first doping concentration of a second conductivity type opposite said first conductivity type;

a first contact pad formed over a portion of said first doped region and laterally extending a selected length across an upper surface of said first doped region;

a first well region of said second conductivity type formed within said first doped region and laterally extending beyond said selected length, said first well region extending through said first doped region into said semiconductor region, said first well region spaced from said underlying region, said first well region having a doping concentration which is less than said first doping concentration;

a second contact pad formed over a portion of said second doped region; and a second well region of said second conductivity type formed within said second doped region, said second well region extending through said second doped region into said semiconductor region, said second well region spaced from said underlying region.

11. The device of claim 10 wherein said first conductivity type comprises a p-doped material and said second conductivity type comprises an n-doped material.

12. The device of claim 11 wherein said doped regions are doped with arsenic dopants.

13. The device of claim 10 wherein said first source-drain region extends a first selected depth from the upper surface of said semiconductor and said well first region extends a second selected depth from the upper surface of said semiconductor region, said second selected depth is five to seven times the depth of said first selected depth.

14. The device of claim 10 wherein said semiconductor region comprises silicon.

15. The device of claim 10 and further comprising field insulation regions adjacent said doped regions.

16. The device of claim 10 wherein said conductive region comprises aluminum.

17. The device of claim 10 wherein said conductive region comprises polysilicon.

18. The device of claim 10 where said second well region has a doping concentration less than said selected first doping concentration.

* * * * *